United States Patent
Ikenaga et al.

(10) Patent No.: US 6,818,986 B2
(45) Date of Patent: Nov. 16, 2004

(54) SEMICONDUCTOR DEVICE AND METHOD OF INSPECTING THE SAME

(75) Inventors: Yuichiro Ikenaga, Kanagawa (JP); Yasushi Otsuka, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/983,253

(22) Filed: Oct. 23, 2001

(65) Prior Publication Data

US 2002/0063250 A1 May 30, 2002

(30) Foreign Application Priority Data

Oct. 24, 2000 (JP) ..................................... P2000-324153

(51) Int. Cl.[7] .......................... H01L 23/48; H01L 21/00
(52) U.S. Cl. ....................... 257/734; 257/736; 257/737; 257/774; 438/59; 438/64
(58) Field of Search ......................... 257/797, 48, 737, 257/738, 447, 772, 778, 781; 438/401, 462, 975, 59, 64; 250/338.4

(56) References Cited

U.S. PATENT DOCUMENTS

| | | | | |
|---|---|---|---|---|
| 4,893,163 A | * | 1/1990 | Rudeck | 257/797 |
| 4,949,148 A | * | 8/1990 | Bartelink | 257/785 |
| 5,403,752 A | * | 4/1995 | Bruchhaus et al. | 438/54 |
| 5,574,285 A | * | 11/1996 | Marion et al. | 250/370.13 |
| 5,716,889 A | * | 2/1998 | Tsuji et al. | 438/401 |
| 5,834,799 A | * | 11/1998 | Rostoker et al. | 257/98 |
| 5,930,588 A | * | 7/1999 | Paniccia | 438/16 |
| 5,972,725 A | * | 10/1999 | Wollesen et al. | 438/14 |
| 5,981,309 A | * | 11/1999 | Kim et al. | 438/60 |
| 6,096,568 A | * | 8/2000 | Dobrovolski | 438/15 |
| 6,329,212 B1 | * | 12/2001 | Dobrovolski | 438/15 |
| 6,340,818 B1 | * | 1/2002 | Izumi et al. | 250/370.13 |
| 6,483,184 B2 | * | 11/2002 | Murata | 257/698 |

FOREIGN PATENT DOCUMENTS

| | | | |
|---|---|---|---|
| EP | 0312217 | * | 4/1989 |
| JP | 62-33434 | * | 2/1987 |

* cited by examiner

*Primary Examiner*—Wael Fahmy
*Assistant Examiner*—Shrinivas H. Rao
(74) *Attorney, Agent, or Firm*—Rader, Fishman & Grauer PLLC; Ronald P. Kananen

(57) ABSTRACT

An IC (semiconductor device) comprises a package substrate provided on its face side with a plurality of wiring patterns such as electrode lands and wirings and provided on its back side with a plurality of electrode bumps corresponding to the wiring patterns, an IC chip mounted on the face side of the package substrate in a face-up manner, a sealing resin sealing the IC chip, and an indication provided on the back side of the package substrate for indicating the position of the IC chip. A method of inspecting a failure reason in the case of some failure of the IC chip comprises the steps of forming an opening by removing from the back side the package substrate in the region surrounded by the indication, mounting the IC chip on a test substrate, passing an electric current to the IC chip for operation, and inspecting and analyzing the reason of failure by a photo-emission analyzing method. The photo-emission analysis can be conducted without processing an upper layer wiring portion or the like of the IC chip.

3 Claims, 2 Drawing Sheets

FAR INFRARED RAYS

SEMICONDUCTOR DEVICE AND METHOD OF INSPECTING THE SAME

BACKGROUND OF THE INVENTION

The present invention relates to a semiconductor device in which a defective portion of a semiconductor chip provided with an electronic circuit integrated in high density (hereinafter referred to as "IC chip") can be easily analyzed by a photo-emission analyzing method, and particularly to a surface mount type semiconductor device in which a plurality of electrode bumps are provided in the form of a ball grid array (BGA) and which is packaged.

First, referring to the figures, the structure of a general BGA package type semiconductor device will be conceptually described.

FIG. 2 is a sectional side view of a thermal enhanced BGA package type semiconductor device, and FIG. 3 is a sectional side view of a plastic molded BGA package type semiconductor device.

A thermal enhanced BGA package (hereinafter referred to as "E-BGA") type semiconductor device (hereinafter referred to simply as "IC") 20 shown in FIG. 2 comprises an IC chip 21 fixed to the back side of a metallic substrate 22 in an opening portion 24 formed at a central portion of a package substrate 23 laminated on the metallic substrate 22, with the side of power source, ground wiring and the like as well as a plurality of electrodes (not shown) of the IC chip 21 directed downward (hereinafter referred to "face-down"), wherein the electrodes are connected by wires 27 to electrode lands (not shown) provided on the package substrate 23, and the IC chip 21 is sealed with a sealing material 25. The package substrate 23 may be a monolayer substrate, but generally is of a multi-layer laminate substrate structure, and a plurality of electrode bumps 26 made of solder in ball shape are provided in a predetermined grid-like array on the back side of the lowest layer of the multi-layer substrate.

A plastic molded BGA package (hereinafter referred to as "P-BGA") type IC 30 shown in FIG. 3 comprises an IC chip 31 fixed on a package substrate 32 provided with wirings such as electrode lands (not shown), with the side of power source, ground wirings and the like as well as a plurality of electrodes (not shown) of the IC chip 31 directed upward (hereinafter referred to as "face-up"), wherein the electrodes are connected by wires 33 to electrode lands (not shown) of the package substrate 32, and the IC chip 31 in such condition and the surface inclusive of the electrode lands of the package substrate 32 are sealed with a sealing resin 34. The package substrate 32 has the same structure as that of the package substrate 23, and a plurality of electrode bumps 35 are provided in a predetermined grid-like array on the back side of the lowest layer of the package substrate 32.

The E-BGA package type IC 20 (hereinafter referred to simply as "IC 20") and the P-BGA package type IC 30 (hereinafter referred to simply as "IC 30") are finally subjected to quality test in a factory, and then sold to the users such as an assembly maker. The user surface-mounts the IC 20 or IC 30 onto the user's electronic circuit substrate by utilizing a substrate or taping.

As shown in FIG. 2, the IC 20 is surface mounted on the user's electronic circuit substrate in the condition where the metallic substrate 22 is disposed on the upper side and the IC chip 21 is directed downward (face-down) so as to enhance heat radiation properties. As shown in FIG. 3, the IC 30 is surface mounted on the user's electronic circuit substrate in the condition where the IC chip 31 is present on the upper side of the package substrate 32 (face-up).

After the IC 20 or IC 30 is mounted, or during the mounting, defective mounting or potential defects present in the IC 20 or IC 30 itself come to appear upon mounting, and the defective IC 20 or IC 30 is returned to the semiconductor maker side. On the semiconductor maker side, the reason of failure or defects in the IC 20 or IC 30 thus returned is analyzed. The analysis is usually carried out by a photo-emission analyzing method.

The photo-emission analyzing method is a method of determining the position of failure on the IC chip in the case where the IC failure mode is a DC characteristic failure such as latch-up and junction collapse. In the case of a MOS type IC, little current flows through a PN junction of a normal transistor, but, in the case of the failure mode, a large quantity of junction current flows, and an excess of the current generates far infrared rays, which are detected by a special detector to thereby determine the position of failure. Although far infrared rays are radiated also in the case of heat generation due to short-circuit of metallic components at wiring portions, the wavelength band in such failure is different from that in the case of the above-mentioned failure mode, so that observation of the far infrared rays is carried out by switching over the wavelength sensitivity.

As has been described above, in the photo-emission analyzing method, it is necessary to detect the far infrared rays coming from a PN junction portion of the transistor. Where the number of aluminum wiring layers provided on the upper side of the PN junction portion is larger, the wirings intersect complicatedly with each other in a network form, so that the far infrared rays radiated from the lowest layer are blocked by the wirings when observed from the face side of the IC chip. Therefore, where the IC chip is formed in a multi-layer wiring structure, observation from the face side of the IC chip is impossible.

However, the far infrared rays can pass through bulk silicon, so that observation of far infrared rays is carried out from the back side of the IC chip opposite to the wiring layer side.

At the time of analyzing a defective IC, power source is applied so as to obtain a normal IC chip operation mode, and analysis is conducted by holding the IC chip in a timing suitable for easy determination.

Therefore, in the case of the IC 20, cutting the metallic substrate 22 has some influence on heat radiation properties but has no influence on the operation of the IC chip 21, so that radiation of far infrared rays can be observed by mechanically cutting the metallic substrate 22 at the portion where the IC chip 21 is present.

In the case of a normal quad flat package (QFP) type IC, the IC chip is constituted by face-up bonding, and, therefore, the mold is cut from the back side, and finally a lead frame is cut to expose the back side of the IC chip (effective signal wires are ordinarily absent in the lead frame).

However, in the case of the IC 30, although it is possible to cut the sealing resin 34 on the upper side of the IC chip 31 and expose the IC chip 31, a power source wiring portion must be removed with a special chemical because a power source layer is provided on the surface of the IC chip 31. The removal may increase the impedance of the power source wiring portion, and may remove necessary portions, resulting in some case in that the IC chip 31 does not operate actually. In addition, as has been describe above, the observation of the far infrared rays from the side of the sealing resin 34 is hampered by the layers of aluminum wirings on the upper side of PN junctions of the IC chip 31. Namely, the aluminum wirings appear as complicated intersections in a network form as viewed from the side of the sealing resin 34, so that far infrared rays are shut off, and analysis by photo-emission is impossible.

On the other hand, at the time of observing the far infrared rays from the back side (lower side) of the sealing resin 34, the whole surface of the IC chip 31 is covered by the package substrate 32, so that a central portion of the package substrate 32 where the IC chip is present must be cut away. The package substrate 32 naturally contains innumerable wiring patterns, so that it is impossible to easily remove the central portion of the package substrate 32 by cutting. It may be contemplated to design wiring so that wiring patterns are absent at a portion on the lower side of the IC chip 31, but it is wasteful that this portion cannot be utilized for pattern wiring. In the case where wiring is so designed that the wiring patterns can be utilized effectively as much as possible, it is necessary to remove the package substrate 32 to accurately expose the whole surface of the IC chip 31 while minimizing the area of removal of the package substrate 32, but it is ordinarily difficult to externally recognize the position of the IC chip mounted inside.

SUMMARY OF THE INVENTION

The present invention has been made to solve the above-mentioned problems. Accordingly, it is an object of the invention to provide a semiconductor device and a method of inspecting the same in which photo-emission analysis can be carried out without processing an upper layer wiring portion or the like of an IC chip.

In order to attain the above object, according to one aspect of the present invention, there is provided a semiconductor device comprising a package substrate provided on its face side with a plurality of wiring patterns such as electrode lands and wirings and provided on its back side with a plurality of electrode bumps corresponding to the wiring patterns, a semiconductor chip provided with an electronic circuit integrated, the semiconductor chip mounted and fixed on the face side of the package substrate in a face-up manner, and a sealing member sealing the semiconductor chip, wherein an indication indicating the position of the semiconductor chip is provided on the back side of the package substrate.

Further, according to another aspect of the present invention, an indication in the semiconductor device may be a mark for providing an opening by removing the back side of the package substrate in the case of analyzing a failure reason of the semiconductor device by a photo-emission analyzing method.

According to still another aspect of the present invention, the indication in the semiconductor device may be formed by etching in an etching step for forming the wiring patterns of the package substrate.

Furthermore, according to yet another aspect of the present invention, there is provided a method of inspecting a semiconductor device comprising a package substrate provided on its face side with a plurality of wiring patterns such as electrode lands and wirings and provided on its back side with a plurality of electrode bumps corresponding to the wiring patterns, a semiconductor chip provided with an electronic circuit integrated, the semiconductor chip mounted and fixed on the face side of the package substrate in a face-up manner, a sealing member sealing the semiconductor chip, and an indication provided on the back side of the package substrate for indicating the position of the semiconductor chip, the method comprises the steps of removing the package substrate at the portion of an area surrounded by the indication to open and expose the back side of the semiconductor chip, mounting the semiconductor device with the back side of the semiconductor chip exposed on an inspecting circuit substrate, passing an electric current to the semiconductor chip, allowing far infrared rays emitted from a defective portion of the semiconductor chip upon the passage of the electric current to be discharged from the opening, detecting the discharged far infrared rays by a far infrared ray detector, and analyzing the defective portion by a photo-emission analyzing method.

Therefore, according to the present invention, it is possible to easily recognize the region where the semiconductor chip is present of the package substrate to be removed, without additional cost, to form an opening portion by removing a portion of the package substrate without damaging the function of the semiconductor chip, and to easily inspect and analyze the failure portion by the photo-emission analyzing method.

The above and other objects, features and advantages of the present invention will become apparent from the following description and appended claims, taken in conjunction with the accompanying drawings which show by way of example some preferred embodiments of the invention.

BRIEF DESCRIPTION OF THE DRAWINGS

FIGS. 1A and 1B show conceptually a semiconductor device according to one embodiment of the present invention, wherein FIG. 1A is a plan view of the semiconductor device as viewed from the back side, and FIG. 1B is a sectional side view taken along line A—A of FIG. 1A.

DETAILED DESCRIPTION OF THE PREFERRED EMBODIMENTS

Now, a semiconductor device and a method of inspecting the same according to one embodiment of the present invention will be described, referring to FIGS. 1A and 1B.

Figure 1A:
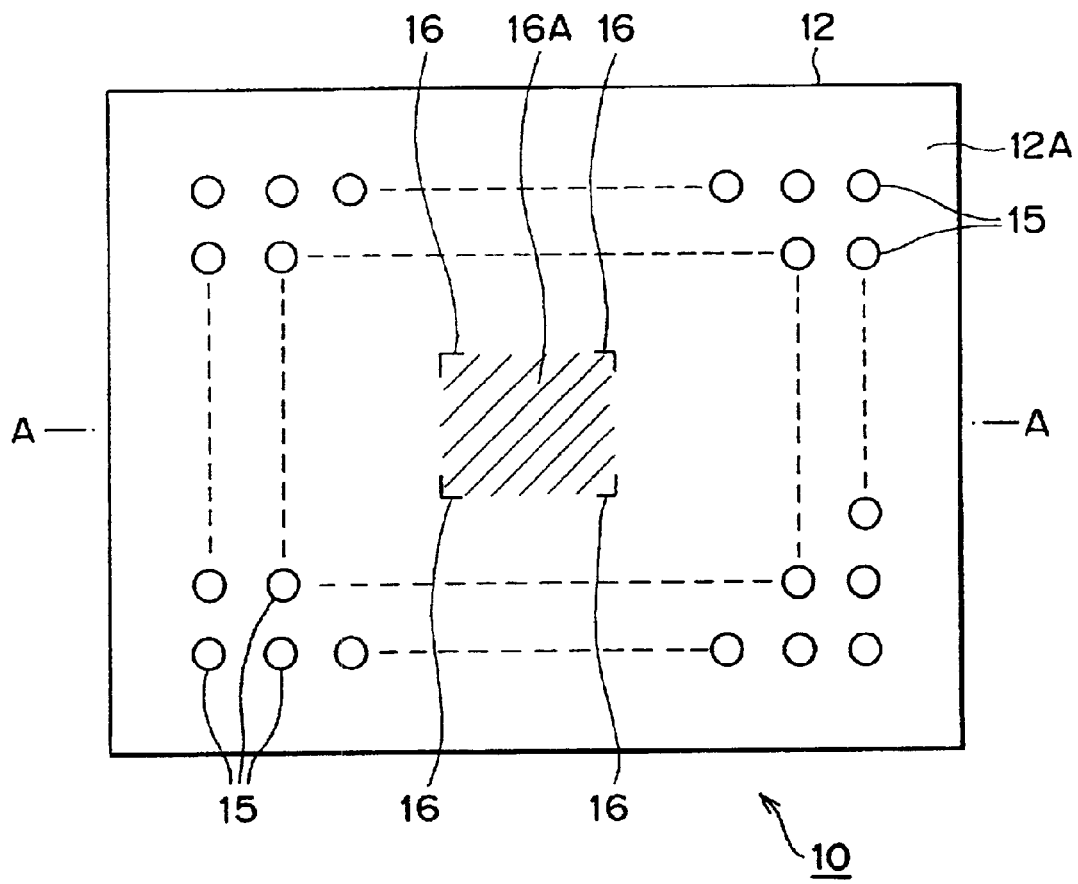
Figure 1B:
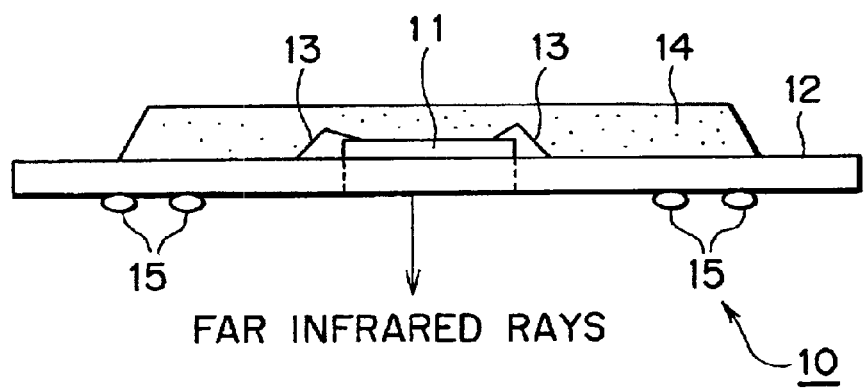
Figure 2:
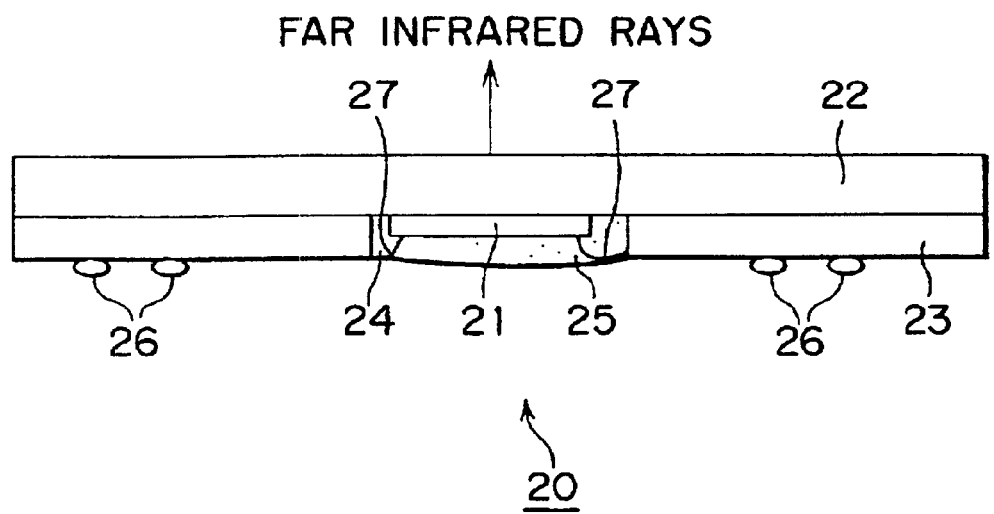
FIG. 2 is a sectional side view of a thermal enhanced BGA package type semiconductor device.
Figure 3:
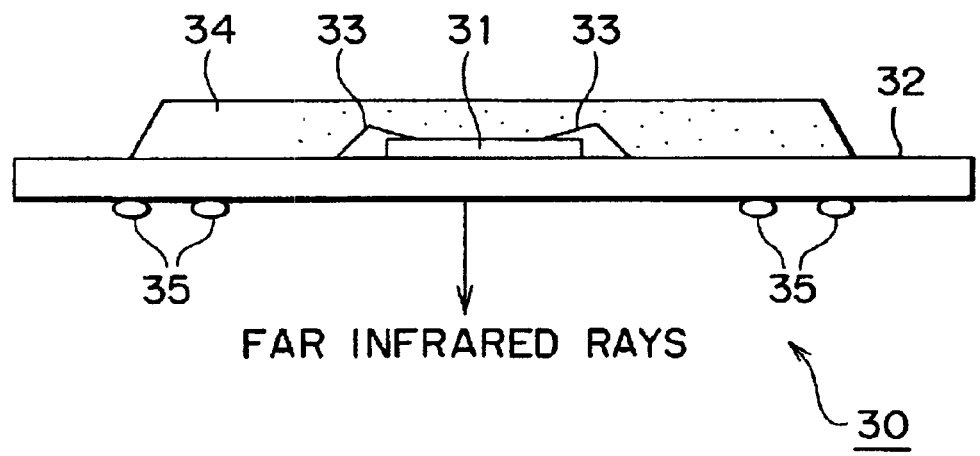
FIG. 3 is a sectional side view of a plastic molded BGA package type semiconductor device.

FIGS. 1A and 1B conceptually show a semiconductor device according to one embodiment of the present invention, wherein FIG. 1A is a plan view as viewed from the back side, and FIG. 1B is a sectional side view taken along line A—A of FIG. 1A.

In the present invention, also, the conventional semiconductor device (P-BGA type IC 30) and the structure thereof are applied, and terms used in the semiconductor device and the photo-emission analysis will be used in the following description.

In FIGS. 1A and 1B, symbol 10 generally denotes a P-BGA type package IC (hereinafter referred to simply as "IC") which is a semiconductor device according to the present invention. In the structure of IC 10, like the structure of the IC 30, an IC chip 11 is fixed on a package substrate 12 provided with wirings such as electrode lands (not shown), with the power source, ground wirings and the like as well as a plurality of electrodes (not shown) of the IC chip 11 directed upward (hereinafter referred to as "face-up"), the electrodes are connected to the electrode lands (not shown) of the package substrate 12 by wires 13, and the IC chip 11 in this condition and the surface including the electrode lands of the package substrate 12 are sealed with a sealing resin 14. A plurality of electrode bumps 15 made of solder in ball-like shape are provided in a predetermined grid-like array on the back side of the lowest layer of the package substrate 12.

As shown in FIG. 1A, the IC 10 is provided, on the back side 12A of the package substrate 12, with an indication 16 indicating the positions of four corners of the IC chip 11. The indication 16 ensures that the whole area of the IC chip 11 sealed inside can be recognized from the back side 12A, and clearly shows the range of the area of the package substrate 12 to be removed by cutting or the like. In the embodiment shown in the figure, the indication 16 is applied to four corners; the indication may also be a solid line or broken line indicating the whole periphery of the area to be indicated.

While the indication 16 may be applied by silk screen printing or the like, it can be provided by direct etching at the time of an etching step for forming wiring patterns on the package substrate 12, whereby it can be provided without an additional step and without additional cost.

In designing the package substrate 12 of the IC 10 according to the present invention, basic pattern wirings are disposed in areas other than the area where the IC chip 11 is mounted and the vicinity of the mounting area; only the lands for heat dissipation, a pattern wiring for strengthening the power source, and part of signal wires irrelevant to the actual operation for IC testing may be laid out beneath the area where the IC chip 11 is mounted.

As for the position of the IC chip 11, where the package substrate 12 is, for example, four-layer substrate, the position of the IC mounted on the uppermost layer and the position of the indication 16 on the lowermost layer can be specified with the accuracy of the pattern superposition of the four-layer substrate.

With the indication 16 thus provided, the worker can remove the portion of the area defined by lines connecting the indication 16 at four corners of the package substrate 12 (the area portion 16A surrounded by the indication 16 at four corners and hatched in the figure), can easily confirm the total exposure of the IC chip 11 inside from the back side 12A, so that the required minimum area portion of the package substrate 12 can be removed without generating the problem of erroneous operation or the like due to excessive removal of the substrate patterns.

Next, in the case of inspection by the above-mentioned photo-emission analysis of a defective portion of the IC 10, an opening (hatched portion 16A in FIG. 1A) is formed in the package substrate 12 in the manner mentioned above, the IC 10 with the thus formed opening is mounted on a test substrate (not shown), a power source is applied so as to obtain a normal operation mode of the IC 10, a test pattern is applied, and the IC 10 is held in the condition of a timing suitable for easy determination. With the power source thus impressed and the test pattern thus inputted, far infrared rays are radiated from a defective portion as described above, the far infrared rays are detected, and photo-emission analysis is carried out, whereby the kind of the defect can be determined.

As has been described above, the present invention provides many excellent effects as follows.

(1) The area to be removed of the package substrate of the IC to be inspected can be easily recognized, and processing is easy.

(2) Removal of the package substrate permits basic operations of the IC.

(3) As a result of above-mentioned effects, photo-emission analysis can be easily carried out.

(4) The indication indicating the semiconductor wafer portion to be removed of the package substrate can be provided by etching at the time of an etching step for forming the pattern wirings, whereby the indication can be provided without need for additional production cost.

(5) Photo-emission analysis can be realized without processing the uppermost layer wiring or the like of the IC chip.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A semiconductor device comprising:
   a package substrate having a plurality of wiring patterns, such as electrode lands and wirings provided on a face with, and a plurality of electrode bumps corresponding to said wiring patterns provided on a back side;
   a semiconductor chip provided with an integrated electronic circuit, said semiconductor chip mounted and fixed on said face side of said package substrate in a face-up manner;
   a sealing member for sealing said semiconductor chip on the face side of said package substrate; and
   an indication mark on said backside of said package substrate that indicates a position of at least one of each corner or a periphery of said semiconductor chip.

2. A semiconductor device according to claim 1, wherein said indication mark is a mark for defining a minimum portion of the package substrate for forming an opening by removing the back side of said package substrate in the case of analyzing the reason for failure of said semiconductor device by a photo-emission analyzing method.

3. A semiconductor device according to claim 1, wherein said indication mark is formed by etching when forming said wiring patterns of said package substrate.

* * * * *